(12) United States Patent
Johnsgard et al.

(10) Patent No.: US 7,176,417 B2
(45) Date of Patent: Feb. 13, 2007

(54) APPARATUSES AND METHODS FOR RESISTIVELY HEATING A THERMAL PROCESSING SYSTEM

(75) Inventors: Kristian E. Johnsgard, Los Gatos, CA (US); Daniel L. Messineo, San Jose, CA (US); David E. Sallows, Union City, CA (US)

(73) Assignee: Mattson Technology, Inc., Fremont, CA (US)

( * ) Notice: Subject to any disclaimer, the term of this patent is extended or adjusted under 35 U.S.C. 154(b) by 500 days.

(21) Appl. No.: 09/998,801

(22) Filed: Nov. 15, 2001

(65) Prior Publication Data

US 2002/0100753 A1    Aug. 1, 2002

Related U.S. Application Data

(60) Provisional application No. 60/249,708, filed on Nov. 16, 2000.

(51) Int. Cl.
*H05B 3/68* (2006.01)

(52) U.S. Cl. .............. 219/444.1; 219/468.1; 219/543; 219/552; 338/22.5; 338/308

(58) Field of Classification Search ............ 219/444.1, 219/468.1, 553, 55.2, 121.43, 385, 391, 408, 219/409, 538, 542, 544; 361/234, 266; 310/358, 310/311; 423/1; 118/715, 728, 723.1; 156/345.2; 338/308
See application file for complete search history.

(56) References Cited

U.S. PATENT DOCUMENTS

| | | | |
|---|---|---|---|
| 4,328,529 A * | 5/1982 | Hierholzer et al. ......... 361/266 |
| 4,433,233 A * | 2/1984 | Hierholzer et al. ......... 219/553 |
| 4,862,029 A * | 8/1989 | Kasai et al. ................ 310/311 |
| 5,502,345 A * | 3/1996 | Kahn et al. ................. 310/358 |
| 5,665,260 A | 9/1997 | Kawada et al. ............. 219/464 |
| 5,748,434 A | 5/1998 | Rossman et al. |
| 5,909,355 A * | 6/1999 | Parkhe ....................... 361/234 |
| 5,994,662 A * | 11/1999 | Murugesh ............... 219/121.43 |
| 6,329,741 B1 * | 12/2001 | Vartuli et al. .............. 310/363 |
| 6,414,834 B1 * | 7/2002 | Weldon et al. ............. 361/234 |
| 6,582,669 B1 * | 6/2003 | Friese ............................ 423/1 |
| 6,646,235 B2 * | 11/2003 | Chen et al. .............. 219/444.1 |
| 2001/0027972 A1 * | 10/2001 | Yamaguchi et al. ...... 219/468.1 |

FOREIGN PATENT DOCUMENTS

| EP | 0 447 155 A2 | 9/1991 |
| GB | 1 564 630 A | 9/1976 |
| WO | WO02/057198 * | 7/2002 |

* cited by examiner

*Primary Examiner*—Robin Evans
*Assistant Examiner*—Leonid M. Fastovsky
(74) *Attorney, Agent, or Firm*—Wilson Sonsini Goodrich & Rosati

(57) ABSTRACT

A resistive heater having a doped ceramic heating element embedded either partially or completely within a matrix of undoped ceramic material. The ceramic may be silicon carbide, and the dopant may be nitrogen. Many of the advantages of the present heater stern from the fact that the materials used for the heating elements and the matrix material surrounding those elements have substantially the same coefficient of thermal expansion. In one embodiment, the heater is a monolithic plate that is compact, strong, robust, and low in thermal mass, allowing it to respond quickly to power input variations. The resistive heater may be used in many of the reactors and processing chambers used to fabricate integrated circuits, such as those that deposit epitaxial films, and carry out rapid thermal processing.

30 Claims, 13 Drawing Sheets

APPARATUSES AND METHODS FOR RESISTIVELY HEATING A THERMAL PROCESSING SYSTEM

REFERENCE TO RELATED APPLICATION

The present application claims priority from U.S. provisional application No. 60/249,708 filed Nov. 16, 2000. Provisional application No. 60/249,708 is hereby incorporated herein by reference in its entirety.

BACKGROUND

1. Field of the Invention

Embodiments of the present invention relate to apparatuses and methods for processing semiconductor substrates. More specifically, embodiments of the present invention relate to apparatuses and methods for resistively heating a thermal processing system.

2. Description of the Related Art

The fabrication of an integrated circuit (IC) on a semiconductor substrate may involve a number of processing steps that are widely varying in scope, nature, or purpose, but which may have in common the fact that they are carried out at an elevated temperature. Examples of IC manufacturing technologies that may involve a heating step include epitaxy, thin film deposition of both dielectric and conducting layers, ion implantation, annealing, junction formation, and the like. Thermal processing may be carried out in a processing chamber having radiant heat sources, such as lamps, RF sources that heat inductively, or resistively heated sources such as heater blocks or susceptors adjacent to a substrate support.

Thermal processing chambers may be resistively heated. A thermal processor of this type may include heating elements connected to a power supply. As a voltage is applied to the heating elements, the resistance of the elements to the flow of electrical current results in a dissipation of power, which provides heat flow to the processing chamber.

A conventional method of resistively heating a processing chamber makes use of a heating element comprising a graphite core coated with a layer of silicon carbide. The silicon carbide is used to seal the graphite core since the graphite may contain impurities. The presence of these impurities, which may be metallic impurities, is undesirable to IC manufacturers since they can find a way onto the semiconductor substrate being processed and interfere with device performance. The silicon carbide coating offers a protective layer that allows a heater comprising a graphite core, with its impurities and contaminants, to be inserted into a reaction chamber.

Conventional heating elements cause a variety of problems. One is that the core and coating materials may have different coefficients of thermal expansion, and as a consequence of the graphite core expanding at a rate different from that of the silicon carbide, the heater may flex or undergo a distortion in shape as the heating element changes temperature.

A second problem may arise as a result of the difference in thicknesses of the two materials comprising the heating element. In some systems, the silicon carbide coating may be only about 0.004 inches thick. Again, due to the difference in thermal expansion coefficients between the two materials, the silicon carbide coating can crack upon heating and cooling of the heating element, exposing the interior of the processing chamber and the substrates being processed to impurities in the graphite. Impurities from the graphite may then diffuse through the cracks in the silicon carbide coating, out of the resistive heating element and into the reaction chamber, causing contamination.

This problem is exacerbated if there is an oxygen environment in the reaction chamber, which may be the case if photoresist is being stripped from a substrate, or if a thermal oxidizing process is being performed in a rapid thermal processing (RTP) chamber. Additionally, oxygen may leak into the chamber through the seals that isolate the chamber from the external environment. Oxygen may diffuse through cracks in the silicon carbide coating to react with the graphite core. The graphite reacts with the oxygen to form carbon monoxide and carbon dioxide gasses (this process is called "ashing"), and the inner core of the heating element may be rapidly eroded. A hot spot results because the resistance of the heater has been dramatically increased at that location where the ashing is taking place. This is a very aggressive reaction and the inner core of the heating element may be consumed in as little as 10 seconds.

A third problem that may be encountered with conventional resistive heating elements is that often the core material is not particularly strong. This is true of graphite. Because of the relative mechanical weakness of a core material such as graphite, the cross-section of a heating element is often large to compensate for its lack of strength. A large size, however, may present other problems. A large heater may have a larger thermal mass as well, which can make the temperature less responsive to changes in power. Delayed temperature changes may result in poor temperature repeatability. Another consequence may be a decrease in the number of substrates that can be processed per unit time ("throughput") due to delays encountered as the chamber achieves the desired processing temperature.

Conventional heating designs have addressed some of these problems by encasing heating elements within an enclosure, as depicted in FIG. 1. The resistive heater shown generally at 100 in FIG. 1 comprises four heating elements 101, 102, 103, and 104 (that may be part of the same trace winding into and out of the plane of the figure), within an enclosure that includes an upper shield 106 and the lower shield 108. Each of the heating elements has a graphite core 110 and a silicon carbide coating 112. The enclosure comprises a graphite portion 114 and a silicon carbide coating 116. The heating elements may be attached to the enclosure with supports 118. In this example, the thickness of the heating elements and the enclosure parts are about 0.25 inches, and the thickness of the silicon carbide coating is about 0.004 inches. An inert gas such as nitrogen, helium, or argon, may flow through space 122.

Again, the reason for enclosing the heating elements within a shell of SiC-coated graphite is that the SiC coating of the heating element is susceptible to cracking due to the different coefficients of thermal expansion (CTE) of the two materials. If the coating cracks, the graphite core is vulnerable to ashing, especially if the heating element is exposed to an oxidizing environment. Ashing of the graphite can lead to an immediate "burn out" and loss of the heater, as well as a release of impurities into the chamber. By enclosing the heating elements within a shell (or shield), it is possible to flush an inert gas into the space surrounding the elements to purge these impurities out of the chamber. The inert gas also serves to prevent any oxygen in the reaction chamber from gaining access to the graphite core.

Thus, exemplary conventional heaters may be thought of as having three pieces: 1) the heating element comprising silicon carbide coated graphite, 2) an enclosing shell comprising silicon carbide coated graphite, and 3) an inert gas being used to purge the space outside the heating element but inside the shell. Upper and lower shields 106 and 108 also serve to provide a more uniform heating environment by distributing the heat flow from the individual elements. Although the shields are successful in diffusing heat from the elements to make a more uniform output, they may also add to the thermal mass of the heater making the heater less responsive to changes in power. The use of shielding of a conventional heater also may result in large and bulky hardware. An exemplary processing chamber containing conventional heaters 202 and 204, respectively, above and below a susceptor, and side heater 206, is shown generally at 200 in FIG. 2. This figure illustrates the large amount of space taken up within a processing chamber utilizing a conventional resistive heater.

What is desired are apparatuses and methods for resistive heating of semiconductor processing which provide, among other things: a compact, less massive configuration, resistance to an oxygen environment, low potential for contamination or degradation, and more predictable changes to shape during thermal expansion and contraction.

SUMMARY OF THE INVENTION

Aspects of the present invention include a resistive heater comprising a doped ceramic heating element that may be either partially embedded or completely embedded in a matrix of undoped ceramic material. In an exemplary embodiment, the ceramic may be silicon carbide, and the dopant may be nitrogen. Advantages may be realized by using materials with substantially the same coefficient of thermal expansion for the heating elements and the matrix material surrounding those elements. Thus, when electrical power is applied to the resistive heater, each of the parts (elements and matrix) expand and contract substantially in unison. The expansion of the plate upon heating is predictable, allowing for tight tolerances in relation to other hardware, such as substrate support pins or wafer lifting pins. In one embodiment, the heater is a monolithic plate that is compact, substantially pure and non-contaminating, non-reactive with an oxidizing or corrosive gas or material, strong, robust, and low in thermal mass, allowing it to respond quickly to power input variations. The resistive heater may be used in many of the reactors and processing chambers commonly used to fabricate integrated circuits, such as those for deposition of epitaxial films, chemical vapor deposition (CVD) films, and those that perform rapid thermal processing.

BRIEF DESCRIPTION OF THE DRAWINGS

These and other features and advantages of the present invention will become more apparent to those skilled in the art from the following detailed description in conjunction with the appended drawings in which.

DESCRIPTION

Figure 1:
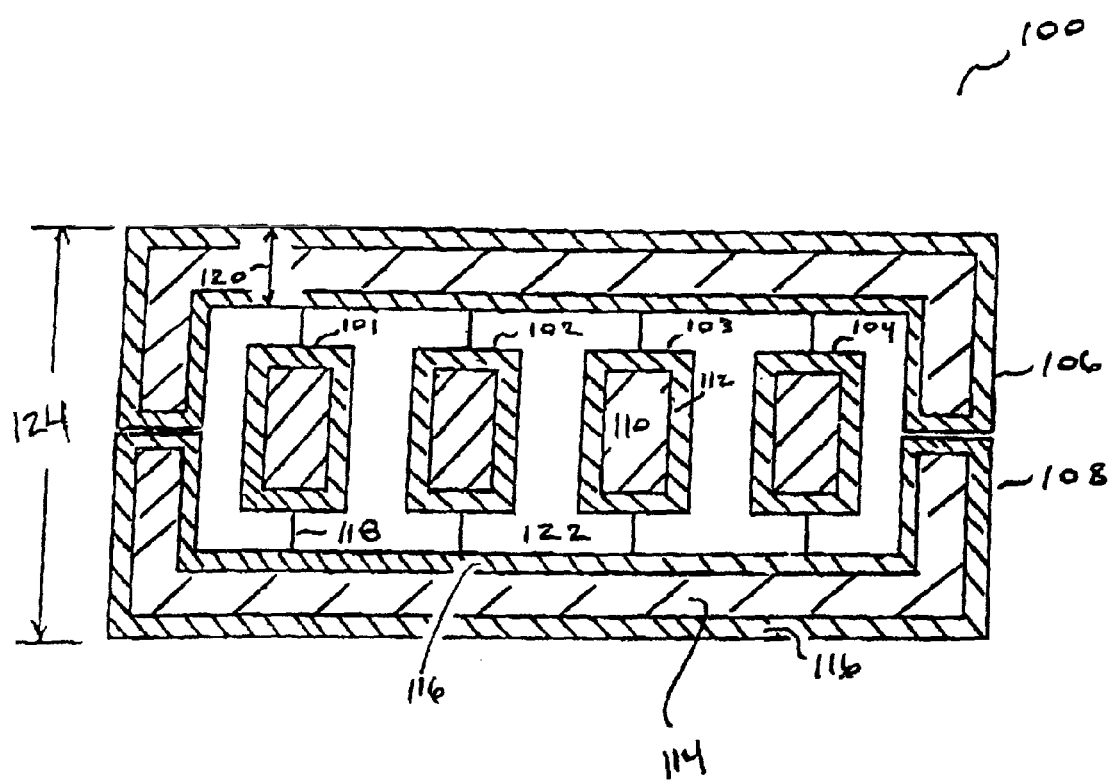
FIG. 1 is a cross-sectional view of a conventional three-part resistive heater comprising silicon carbide coated graphite heating elements and shielding parts.

Aspects of the present invention provide apparatuses and methods for processing semiconductor substrates. The following description is presented to enable a person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, and should be accorded the widest scope consistent with the principles and features disclosed herein.

In some respects, the properties of silicon carbide are highly desirable for the heating element of a resistive heater. Silicon carbide is very robust mechanically, and pure in the sense that it is non-contaminating when disposed within a semiconductor processing chamber. Metals do not readily diffuse through a silicon carbide film. The diffusion of a metal through silicon carbide is very slow even at elevated temperatures. Other ceramics may have desirable properties as well.

In other respects, silicon carbide is not an ideal material for a resistive heating element. Silicon carbide has a high resistance, so a very high voltage at a very low amount of current would be required to drive it. It is also very difficult to machine, due to its hardness. To make a heater in any useful shape would likely require diamond cutting tools. Thus, silicon carbide may not be viable for use in commercial heating elements.

Embodiments of the present invention circumvent the problems of conventional silicon carbide coated graphite heaters, and the difficulties of fabricating heaters from "pure" silicon carbide, by providing a heater element (heater trace) that is fabricated from a doped ceramic. An example of such a doped ceramic is silicon carbide doped with nitrogen. In an exemplary embodiment of the present invention, a heating trace is fabricated from a nitrogen doped silicon carbide material available from Performance Materials, Inc. This material has been called Low Resistivity Performance SiC™.

There are other elements that may be used to lower the resistivity of a ceramic. These elements include zirconium, titanium, and/or boron, and they may used alone or in combination with nitrogen. Alternate elements may be used as long as they are stable at high temperatures, the doped ceramic is stable at high temperatures, the dopants do not diffuse from the low resistivity areas into adjacent high resistivity layers, and as long as the dopants do not produce volatile compounds that may outgas from the doped ceramic. Alternate ceramics may include aluminum oxide, boron nitride, and silicon nitride. Alternate dopants for the low resistivity material are As, Sb, and P.

The doped material may be doped silicon. In this case, dopants may also include B, As, Sb, N, and P. These materials may be deposited over the ceramic, which may be silicon carbide, using chemical vapor deposition (CVD) techniques. It is well known that CVD silicon carbide is adherent to films of doped silicon, since epitaxial silicon films are routinely grown on susceptors coated with SiC.

Doped silicon carbide may be fabricated using CVD methods. CVD grown materials offer advantages over the sintered form in that materials grown by the former method have better integrity and tend to be nonporous. Sintered material (made by pressing together fine particles of the material to make a part) may be used, but is not as desirable because the binders used to coat the particles have impurities in them that become part of the product. In addition, the sintered product tends to be more porous and less homogeneous than the CVD-grown variety.

Undoped silicon carbide is not a desirable material for a resistive heater because it cannot be easily machined and its resistance is high. However, applicants have discovered doped silicon carbide may be used for a resistive heater to achieve desired properties. One example of doped silicon carbide is nitrogen doped silicon carbide. A consequence of doping silicon carbide, with nitrogen for example, is that the electrical resistance of the material may be reduced by 4 to 5 orders of magnitude relative to the undoped or "pure" material. In exemplary embodiments, the resistivity of the doped ceramic may be about 2 to 5 orders of magnitude lower than the resistivity of the undoped ceramic. Of course, more than one doping element may be employed, and each element may not necessarily serve the same purpose. In some embodiments, for example, a first element may be used to reduce resistivity while a second is added to enhance machinability. An exemplary doping level may be from about 150 to about 2000 ppm (parts per million) by weight, which in one embodiment is about 1400 ppm.

Doped ceramics can furnish a wide range of desirable resistive heater properties. For example, increasing the electrical conductivity allows the doped material to be driven in a more reasonable voltage/current regime than the undoped material. In exemplary embodiments, a doped ceramic, such as nitrogen doped SiC, may be used to produce a heater trace with a resistivity lower than undoped SiC, but higher than graphite. Heating traces comprising low resistivity materials, such as graphite, may be required to be fabricated with significant length to provide enough resistance to be reasonably driven (wherein "reasonably driven" means, among other things, avoiding the need for a low voltage, high amperage power supply). Alternatively, the graphite element could be made thin to increase resistance, but there would typically be a limit on how thin the part can be made due to strength considerations. The use of doped silicon carbide makes it practical to operate in a reasonable voltage and current regime, and to vary the length of the heater trace in some applications.

Another advantage of doped silicon carbide as a heating element material is that doped silicon carbide can be readily machined by a technique known as electrical discharge machining (EDM). This is a technique of machining whereby a slab of material may be cut with a device having a head with a wire feed that goes around a roller and out of the machine. The roller constantly feeds wire out of the machine. The slab is grounded and an electrical potential is applied to the wire. As the wire is drawn through the slab the material is essentially evaporated. The cut may be as thin as 0.001 inches. Another type of cutting that may be done by EDM is plunge cutting, where an electrical potential is applied to a graphite mandrel, which is pushed through the material to bore a hole. Like EDM cutting, highly precise holes may be machined in a material with accurate dimensional stability.

There are several ways of using EDM technology that can provide reasonably inexpensive and very precise machining. Advantages of EDM machining may include the ability to easily rework previously fabricated parts. In fabricating resistive heater elements using doped silicon carbide in accordance with exemplary embodiments, it is relatively easy to modify heating characteristics of different portions of the heater after the heater has been fabricated. If, for example, more power is needed in one portion of the heater, EDM techniques may be used to remove a small portion of the doped-SiC, creating a region having a smaller cross-section and higher resistance, and therefore allowing more power to be delivered from that region of the heater. In contrast, SiC-coated graphite parts are not readily adapted for such modifications after the SiC layer has been applied to graphite.

Conventional EDM techniques are not used to machine pure silicon carbide because this material has such a high dielectric constant (high resistivity) that there is no conductive path from the wire to the part being machined, and the wire cannot evaporate the pure silicon carbide. Doped silicon carbide is a good material for a resistive heater not only because of its lower resistivity relative to pure silicon carbide, but also because it may be machined using EDM techniques whereas pure silicon carbide may require machining by diamond tipped tools.

Figure 2:
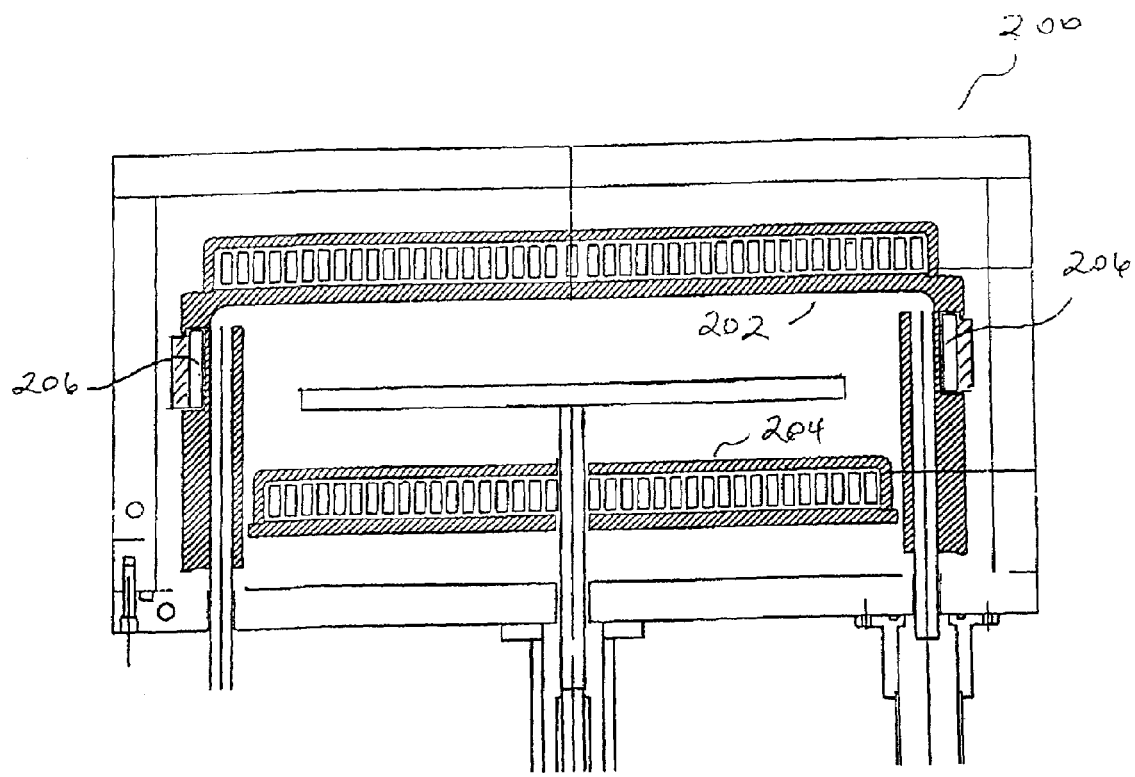
FIG. 2 is a cross-sectional view of a thermal processing chamber with top and bottom conventional resistive heaters.

The dimensions of an exemplary conventional graphite element in cross-section range from about 0.2 to 0.5 inches in width and about 0.5 to 1.0 inches in height. These dimensions are determined by the electrical properties as well as mechanical strength. The resistivity of graphite is between approximately 0.00076 and 0.001 ohm cm, which is low. To fabricate a heater from graphite with enough resistance for reasonable voltage and amperage characteristics for the power supply, the heater may be very long or have a very small cross-section. The size of the cross-section is somewhat limiting, however, because of mechanical strength. Typically the heater has to be long enough to provide sufficient resistance from end-to-end for the driving voltage to be practical. Heaters in RTP applications operating at 30 volts may draw, for example, 120 amps of current. This requires a special power supply and is not available directly from a conventional AC wall outlet. In order to achieve the desired temperature uniformity, however, the heating elements may be stacked very close to one another as shown in FIGS. 1 and 2.

Although the resistivity of doped silicon carbide may be 4 to 5 orders of magnitude lower than undoped silicon carbide, that resistivity may still be higher than graphite. This is an advantage because it allows the use of a heating element to be fabricated such that, in cross-section, the heating elements lie flat, as shown in FIGS. 3 and 4. The dimensions of the doped silicon carbide heating elements (traces) according to an exemplary embodiment of the present invention range from about 0.1 to about 0.3 inches in height, and about 0.5 inches in width. The difference in electrical properties of doped ceramic versus graphite allows for a more compact heating design, and the orientation of the heating trace as a result leads to better temperature uniformity.

A variety of process flows may be used to fabricate heaters according to embodiments of the present invention. Three exemplary procedures are shown in FIGS. 3A–3E, 3F—3F, and 3I–3O, respectively.

Figure 3A:
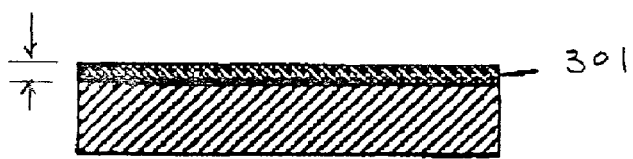
FIGS. 3A–3E illustrate an exemplary process flow for manufacturing a heater according to one embodiment of the present invention.
Figure 3B:
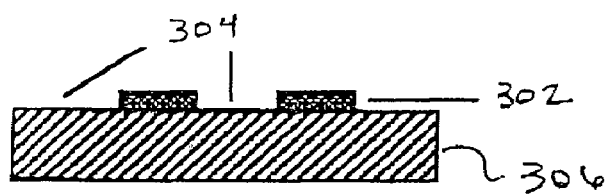

FIGS. 3A–3E show an exemplary process flow that may be used to manufacture a heating plate according to embodiments of the present invention. Heating elements may be machined from a stock sheet of doped silicon carbide 301 (referred to hereinafter as "doped-SiC") by plunge cutting spaces 304 from sheet 301. The plunge-cutting step removes material from regions 304 of the sheet, as depicted in FIG. 3B. This step creates isolated elements of a heating trace which in cross-section may appear as heating elements 302. The plunge-cutting step may be done with the stock sheet of doped-SiC attached to a support block 306, which in the exemplary embodiments is graphite. It will be appreciated that heating elements 302 may comprise a continuous heating trace such that each of the elements depicted in FIG. 3B are part of the same trace, or there could be several traces such that any one particular heating element 302 is not necessarily part of the same electrical circuit as its neighbor.

Figure 3C:
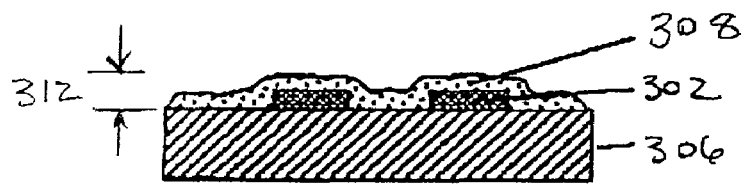

In the next step of the exemplary manufacturing process, a layer of nondoped SiC (having its normal electrical resistance) may be deposited over the elements by placing graphite support block 306 into a processing chamber capable of depositing films, such as a chemical vapor deposition (CVD) chamber. Non-doped, normal resistance SiC layer 308 is shown in FIG. 3C after the deposition is completed. At this point, the graphite support block 306 may be removed by either machining it off, or by placing the structure in an oxygen atmosphere, at an elevated temperature, to ash away the graphite. In either case, what remains is composite layer 312. The thickness of the undoped ceramic layer 308 (represented by 310 in FIG. 3D) with heating elements 302 embedded partially therein, forming composite 312, is about 0.05 inches in this exemplary embodiment.

Figure 3D:
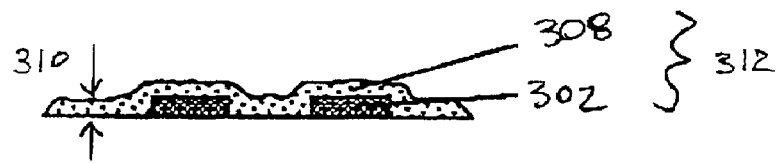
Figure 3E:
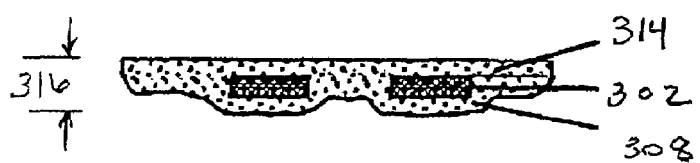
Figure 4:
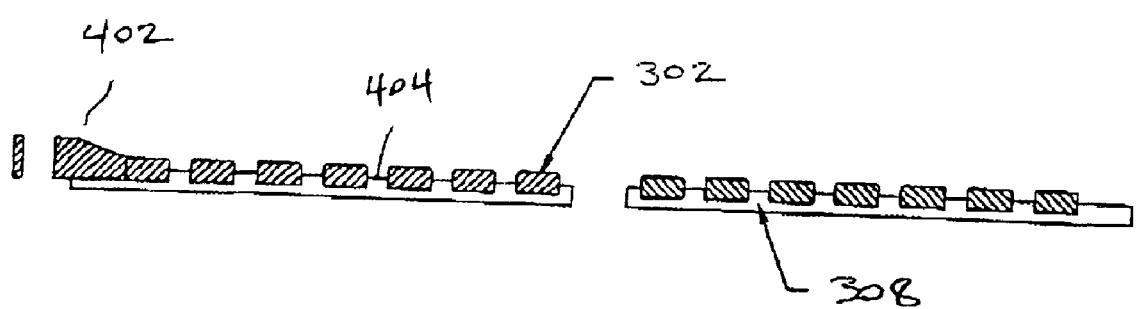
FIG. 4 is a cross-section of a heater according to another embodiment of the present invention.

The stage of the manufacturing process after the graphite block is removed from the structure in FIG. 3D has the resulting composite 312 comprising a plate of undoped-SiC with the heating element 302 nested partially within its interior. Because the concentration of the dopant in the doped-SiC heating element material is very low, the resulting composite 312 comprises a solid monolithic plate that, mechanically speaking, functions substantially as if it is essentially one material. Thus, even at this stage, the plate is very strong, and well behaved during thermal expansion.

An example of a heating plate that has been processed to this stage is shown in FIG. 4, where the plate is being used in an inverted orientation relative to the way it was fabricated. It should be noted that the exposed surface of heating element 302 is not flush with surface 404 in this exemplary embodiment, because the heating trace is only partially embedded in layer 308. An electrical connection may be made between the trace and a power supply at terminal 402.

Referring to FIG. 3D, the underside of composite 312 may be coated with a second layer of undoped-SiC 314 after the graphite substrate block 306 has been removed. In this embodiment, heating elements 302 are now completely encapsulated in the undoped-SiC matrix (by layers 308 and 314). While some embodiments may not use a second layer 314 of undoped-SiC, the plate is a little stronger mechanically as a result of the increased thickness (represented by 316 in FIG. 3E).

Figure 3F:
FIGS. 3F–3H illustrate a second exemplary process flow for manufacturing a heater according to one embodiment of the present invention.
Figure 3G:
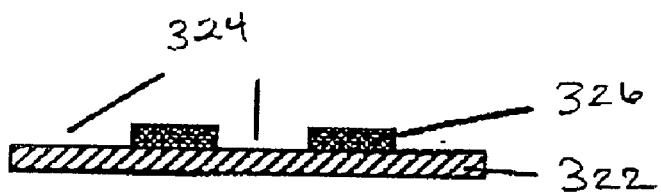
Figure 3H:
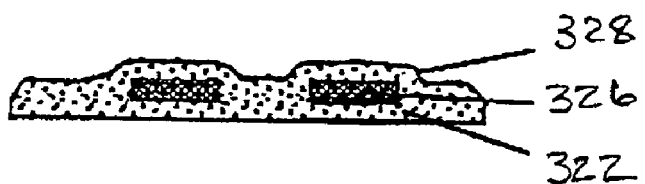

A second exemplary process flow for fabricating a monolithic heater plate is shown in FIGS. 3F–3H. In FIG. 3F, a layer of low resistance, doped ceramic 320 (which could be SiC) is deposited onto a plate of normal (high) resistance, undoped ceramic 322 (which again, could be SiC). The low resistance, doped ceramic layer 320 is then machined using, for example, the EDM techniques discussed above, to form heating trace elements 326 by removing material at regions 324 in FIG. 3G. If full encapsulation of the heating elements is desired, a layer of normal resistance, undoped ceramic (such as SiC) 328 may be deposited onto the structure, as shown in FIG. 3H.

Figure 3I:
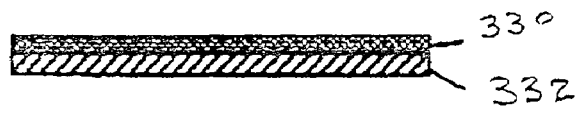
FIGS. 3I–3O illustrate a third exemplary process flow for manufacturing a heater according to one embodiment of the present invention.
Figure 3J:
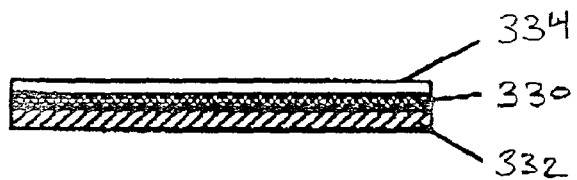
Figure 3K:
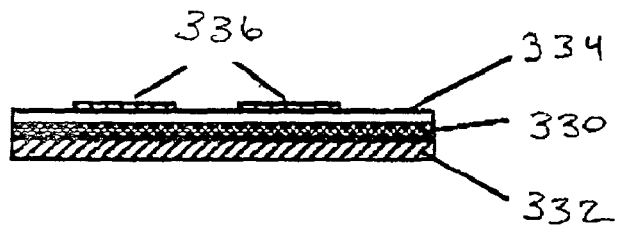
Figure 3L:
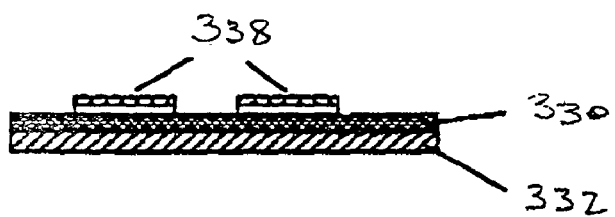

A third exemplary process flow for fabricating a monolithic heater plate is shown in FIGS. 3I–3O. In FIG. 3I, a layer of doped polycrystalline silicon 330 ("polysilicon") is deposited onto a layer of normal resistance ceramic (such as SiC) 332. Next, a masking layer 334 is deposited on top of polysilicon layer 330 (FIG. 3J), and patterned to form patterned mask 336 (FIG. 3K). In an exemplary embodiment the masking material may be silicon dioxide, and the silicon dioxide may be formed by a thermal reaction of oxygen with the polysilicon as an alternative to deposition. It will be appreciated that other masking materials could be used, such as silicon nitride.

Figure 3M:
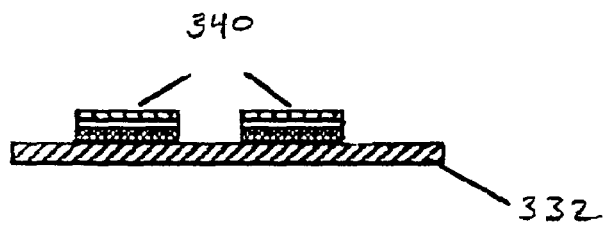
Figure 3N:
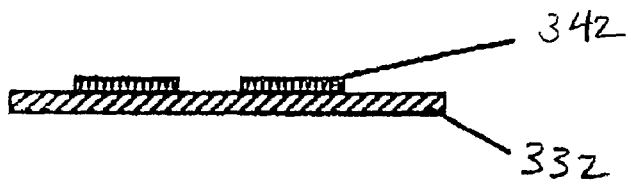

Patterned mask 336 is then transferred into the masking layer 334 by etching away exposed areas to form patterned mast 338 (FIG. 3L), and that pattern is subsequently transferred into the doped polysilicon layer 330 to form patterned mask 340 (FIG. 3M). The heating trace comprising elements 342 are thus formed after the photoresist and polysilicon mask is stripped off (FIG. 3N). If full encapsulation is desired, a layer of normal resistance ceramic (such as SiC) 344 may be deposited over the heating elements 342 such that the heating elements are fully encapsulated by layers 332 and 344.

Figure 3O:
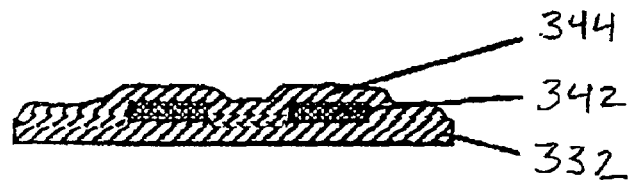

There are additional advantages of nesting the doped ceramic heating elements within a matrix of an undoped version of the same (or a compatible) ceramic. In this context, "compatible" refers to ceramic materials that have, for example, substantially the same CTEs, hardness, or strength. The matrix of undoped ceramic material surrounding the doped ceramic heating trace solidifies the various portions of the trace into a fixed shape. Again, although the heating elements in FIGS. 3A to 3O are depicted as discrete rectangles in cross-section, the trace itself may be a continuous strip of the electrically conducting material crossing into and out of the plane of the figure. The trace could be configured in a variety of shapes, and in some embodiments may not even lie in a single plane. In some embodiments the shape of the trace when viewed from above may take the form of a round coil, square spiral, meandering snake, maze, or any variety of configurations providing desired heating properties.

Figure 5:
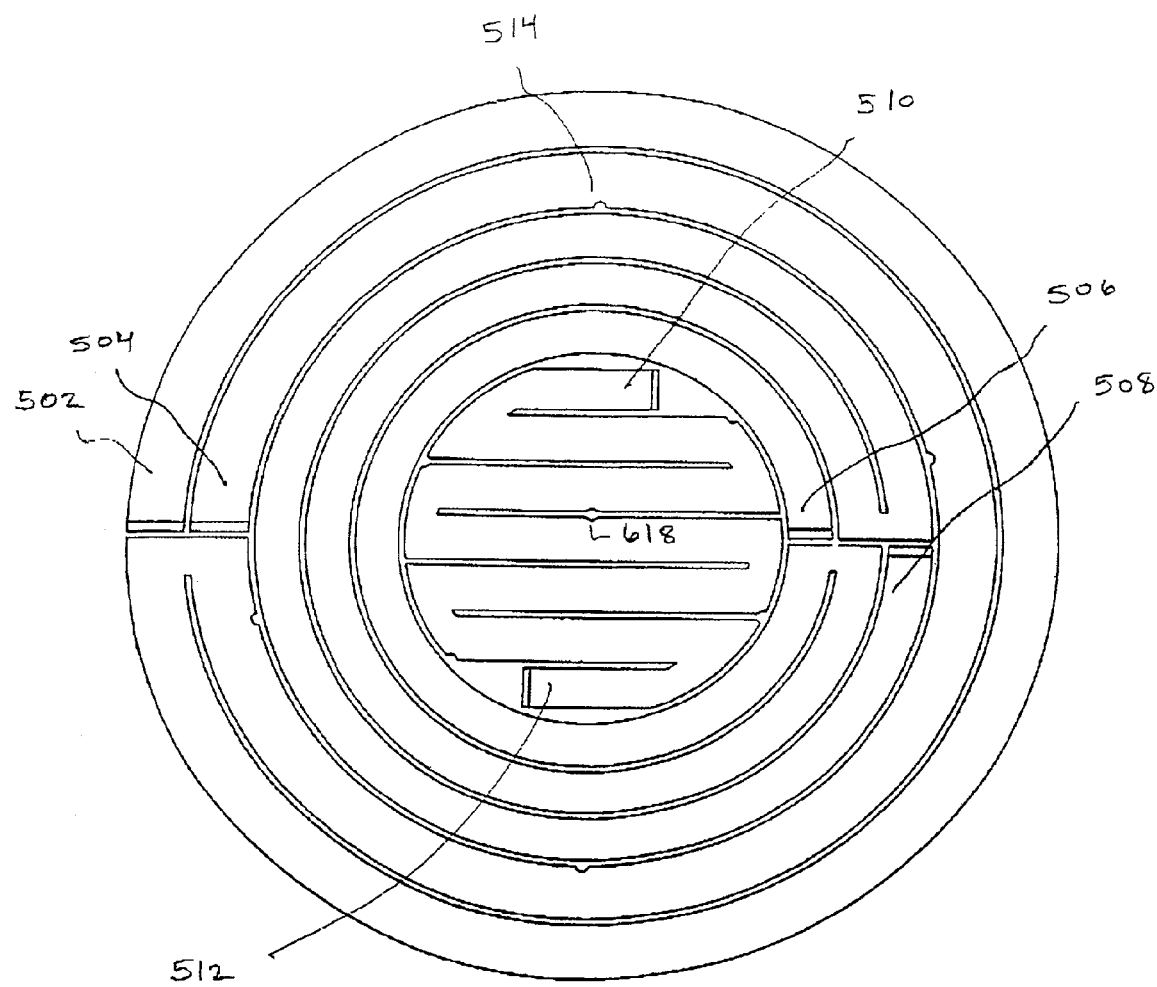
FIG. 5 is a plan view of a monolithic heater plate according to an exemplary embodiment of the present invention.

One such configuration is depicted in a plan view in FIG. 5, where three individual heating traces are positioned in a single plane. The ends of each strip may be connected electrically to a power supply. The outer trace has two ends 502 and 504 that are positioned adjacent to one another.

Starting at 502, the trace circles clockwise around the outer perimeter. After completing the perimeter, it turns back and circles counter clockwise around an adjacent loop with a smaller radius, finishing at 504. Starting at end 508, a middle trace circles clockwise around a loop at one radius, turns back and loops counterclockwise at a shorter radius, and turns back again and loops clockwise at an even smaller radius, finishing at end 506. Thus, the middle heating element comprises a series of concentric loops that alternate in direction with each turn around the circle. The inner trace fills the central circular area of the plane by bending linearly back and forth across the circular area, moving its way from end 510 on one side of the circular area to end 512 on the other side of the circular area.

The use of multiple traces allows a heater to be constructed to have different temperature zones, which vary depending on how the traces are connected to power supplies. For example, ends 502 and 504 may be connected to a first power supply, ends 506 and 508 may be connected to a second power supply, and ends 510 and 512 attached to a third power supply. This exemplary heater would then have three independently powered zones.

The use of a multizone heater solves an ongoing problem encountered in the design of certain semiconductor processing chambers. Heat may be lost at the edges of a substrate during processing due to the fact that the sidewalls of the chamber are absorbing heat. This heat loss may be compensated for by providing a peripheral edge heater in exemplary embodiments of the present invention. In some embodiments using multiple traces, higher power is provided to outer heater zones.

It can be difficult to register the ends of a trace in a conventional heater as power is applied to the heating elements because the materials comprising the heater expand as a result of the increase in temperature. It is desirable to maintain the ends at a fixed distance of separation and orientation to one another in certain exemplary embodiments, because they may be connected to a power supply in a fixed configuration which does not compensate for expansion of the heater. A heater in the shape of a coil, for example, has a tendency to unwind upon thermal expansion, with the ends moving relative to one another like a coiled watch spring that uncoils when released. Portions of the heater and its elements may lift, turn, buckle, or otherwise distort relative to other portions. Embedding the heater element within a matrix of a material with substantially the same coefficient of thermal expansion significantly reduces this effect by fixing the ends of the element in one position.

Figure 6:
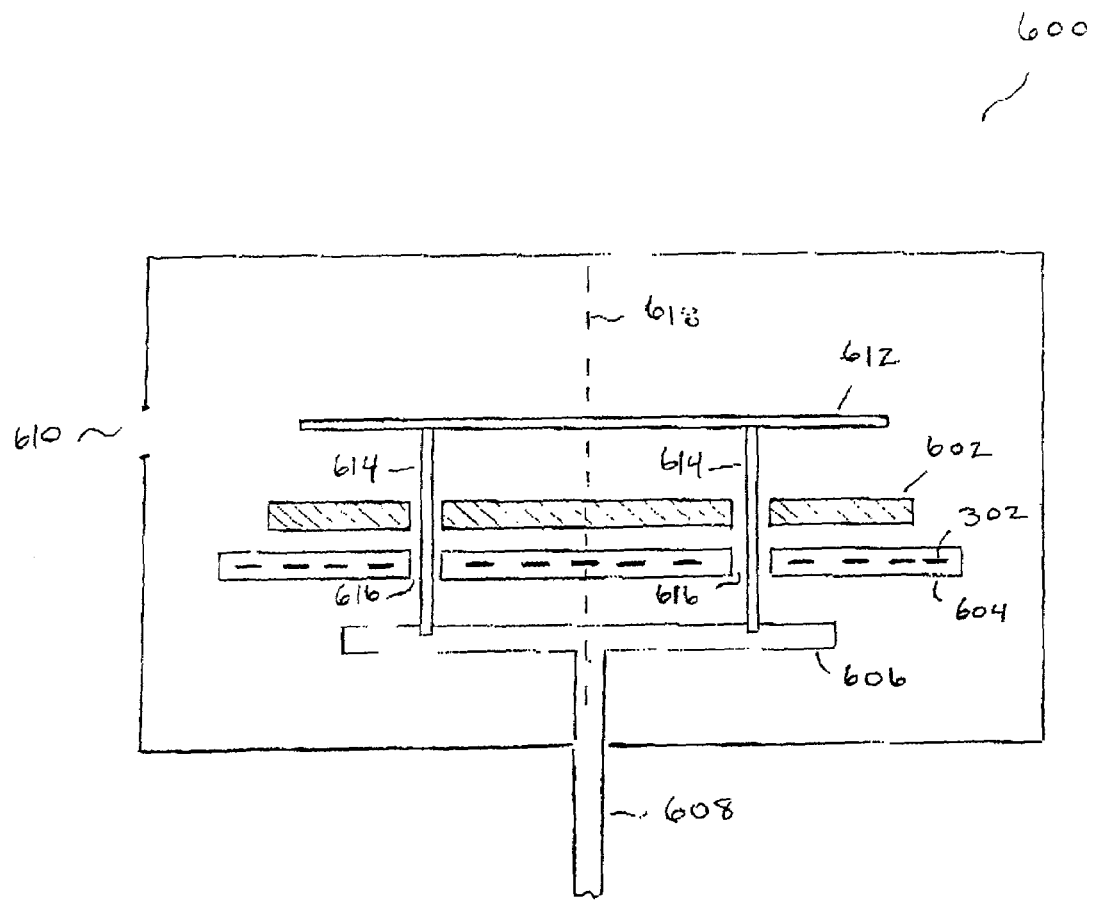
FIG. 6 is a cross-sectional view of a processing chamber including an exemplary monolithic heater plate and substrate lift/support pins.

A monolithic heater plate that predictably changes shape when thermally expanding or contracting has the additional benefit of allowing tighter dimensional tolerances. This can be important if the plate is mounted in a processing chamber in a compact area, and/or in close proximity to other fragile hardware. For example, semiconductor processing chambers may use lift pins that pass through a susceptor, heater plate, or heater block, to raise and lower the semiconductor substrate during substrate loading/unloading process. A simplified diagram to illustrate this is provided in FIG. 6. An exemplary processing chamber shown generally at 600 includes a susceptor 602 mounted above and parallel to a heater plate 604, which in turn is mounted above a lift pin support plate 606. The lift pin support plate is raised and lowered by shaft 608. A semiconductor substrate 612 is introduced to and removed from the processing chamber through opening 610 by a robotic arm (not shown). Shaft 608 is raised until lift/support pins 614 make contact with the semiconductor substrate to be processed, lifting the substrate from underneath and supporting it above the robotic arm such that the robotic arm can be withdrawn. The shaft may then be lowered to allow substrate 612 to rest on or adjacent to susceptor 602 for processing. According to embodiments of the present invention, heater plate 604 may also be used as a susceptor, eliminating the need for two separate pieces of hardware to support and heat the substrate. In an exemplary embodiment of this approach, susceptor 602 would be removed from the reactor and lift/support pins 614 would position the substrate on or adjacent to heater plate 604 for processing. This advantage may be accomplished with the heater of FIG. 3C and other embodiments of the invention.

Lift/support pins 614 pass through heater 604 and susceptor 602 to make contact with substrate 612. It is desirable for the support pins to move freely through holes 616 in the heater. The heater plate can move relative to other hardware parts in the chamber as electrical power is applied to the plate, and as the materials comprising the plate undergo thermal expansion upon heating. Lift/support pins 614 may be made from material such as quartz or silicon carbide, since these materials are compatible with typical semiconductor processing procedures, but the small size of a typical support post may make the lift pins fragile. It will be appreciated that an undesirable condition arises if a portion of the heater plate expands against a support pin, or otherwise changes the alignment of the pin to its hole, restricting the movement of the pin through the hole causing particles from the pin and heater plate to be released into the chamber. The pin could even be sheared off if the plate expands such that the hole in the plate is not in register with the pin. In some instances, the clearance between a support pin and the edge of the hole could be 0.05 inches, and a relatively small shifting of the plate could cause a problem.

Figure 7:
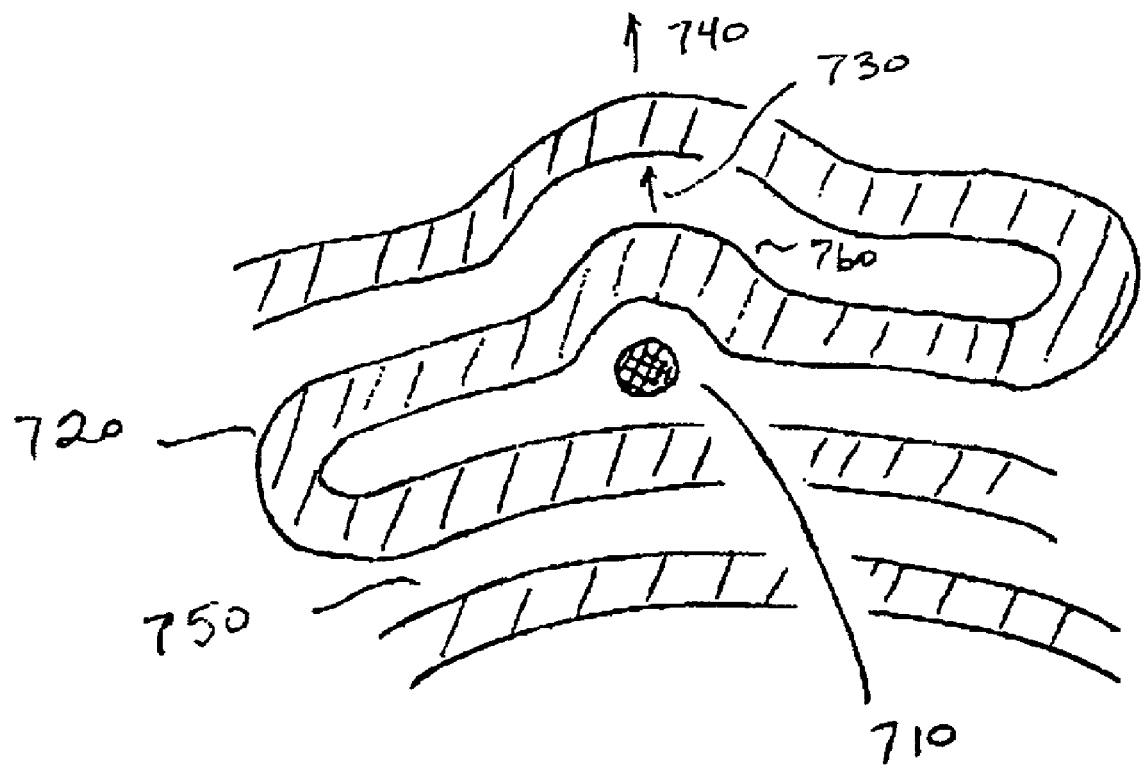
FIG. 7 is a simplified schematic illustrating the effect a substrate support pin hole has on the design of a heater trace.

The heating elements within a heater plate may take a convoluted pathway through the plate, complicating the design of the placement of the substrate support holes. An example is shown in FIG. 7. Referring to FIG. 7, opening 710 has been located in what otherwise would have been the path of element 720, necessitating displacement of the element along radial direction 730. Note that the portion of the heating element shown at 740 which may be the same element or a different element, depending on the configuration of the heating element(s), are also affected. Conventional heaters may suffer from delamination, cracking, or other types of physical trauma due to the increased stress levels at irregularities such as 760 experienced by dissimilar properties of the heating element and adjacent materials, such as a mismatch of the coefficients of thermal expansion of the two materials. These problems are circumvented when the element 720 and matrix 750 materials have substantially the same coefficients of thermal expansion, which is the case with the SiC and nitrogen doped SiC exemplary embodiment of the present invention.

In exemplary embodiments of the present invention the heating elements may be encapsulated or embedded within a similar material to form a solid, monolithic plate. This provides both thermal and mechanical advantages. Thermally, the movements of the plate upon expansion and contraction are more predictable, allowing for more efficient and sophisticated designs with regard to the physical and dimensional relationships of parts within a processing chamber. The enhanced predictability of the movements of a monolithic heating plate may be seen in the following example concerning substrate support pins.

Figure 8:
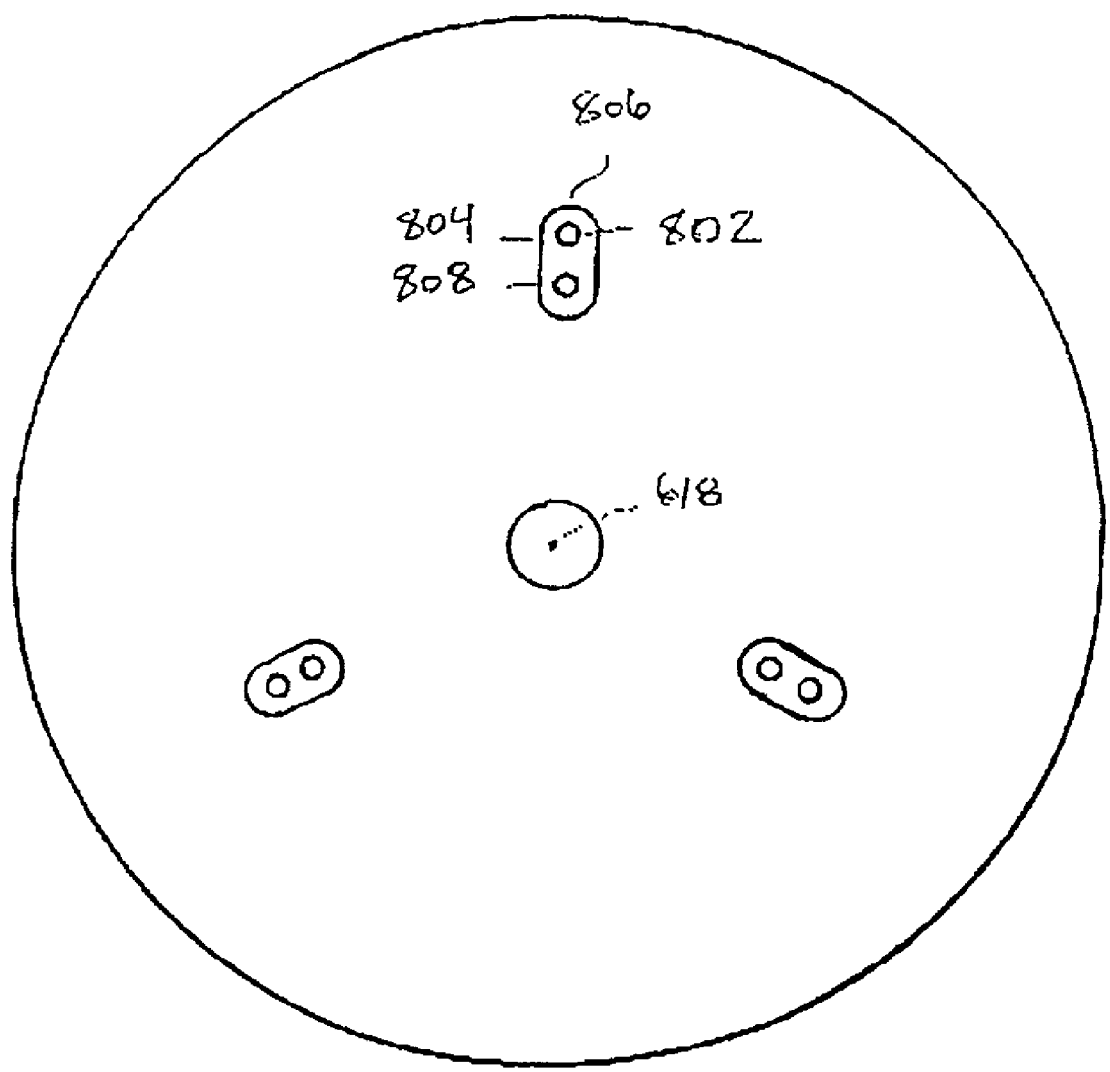
FIG. 8 is a simplified schematic showing the manner in which a monolithic heating plate expands in relation to a substrate lift/support pin.

A heating plate may be registered to the center of the processing chamber, such as along axis 618 in FIG. 8. As power is applied to heating elements and the plate undergoes thermal expansion, the materials in the plate move out predictably in a radial direction, away from the central axis of registry. Embodiments of the present invention include an oval shaped hole 514 in the plate for the support pin to pass through. The hole is oval shaped to allow for the predictable outward, radial expansion of material in the plate upon heating.

Referring to FIG. 8, pin 802 may be at position 804 in oval shaped pin hole 806 when the heater is cold. As power is applied to the heater and the plate expands radially outwards from axis 618, the pin may shift in position, relative to hole 806, from about position 804 to about position 808. The pin hole is shaped to allow for this expansion. Since the heating element and matrix materials have substantially the same coefficients of thermal expansion, this movement of the plate is very predictable. Hence, the relationship between the plate support pin holes and the support pins themselves may be designed with tighter tolerances, allowing for a more compact design and more reliable performance.

There are further advantages of a monolithic heater plate having to do with thermal properties. The temperature profile of a conventional heater, such as that shown in FIG. 1, is nonuniform with hot spots adjacent to the elements and cold regions between elements. It should be recalled that one reason for using upper shields 106 and 108 in the conventional example of FIG. 1 is to help diffuse the heat into a more uniform profile. In contrast, matrix material is in intimate contact with elements 302 to more readily allow the diffusion/conduction of heat from the elements into the regions between the elements. Using the thermal conductivity of silicon carbide, for example, thermal modeling results have shown that a plate whose elements are at about 1150° C. will suffer a temperature drop through the matrix material between any two adjacent elements of only about 3° C. Embodiments of the present invention can therefore be used to provide a monolithic plate with improved temperature uniformity.

Another advantage of a monolithic heater plate has to do with the dynamics of its thermal properties. The conventional heater shown in FIG. 1 is "bulky" not only because of the large size (in cross-section) of its graphite heating elements (to achieve adequate mechanical strength because graphite is a weak material), but also because of the additional shield (106/108) assembled to surround the heating elements. Thus an outer shell is used to diffuse the heat emitted from the heating elements, and to enclose a space for flowing a purge gas around the elements. The exemplary monolithic plate of the present invention has a total thickness of only about 0.15 to about 0.3 inches (316 in FIG. 3E), compared to a thickness (120 in FIG. 1) for just the shell alone in the conventional example. The height of the conventional heater (124) in its entirety may be, for example, about 1.5 inches. Thus, the monolithic plate heater can be used to provide a more compact design: as much as 1/10 the size of the conventional design. In some embodiments, as described above, a heater according to embodiments of the present invention also may not require a separate susceptor.

The reduced mass of the monolithic plate heater, compared to that of a conventional heater, has implications with regard to the rate at which the heater reaches and maintains a processing temperature. The lower the mass of a heater, the less the material there is to heat during a temperature ramp up, and, therefore, the faster that heater will reach the processing temperature. Various semiconductor processing tools are designed with the goal of achieving a processing temperature quickly, and to maintain that temperature even while semiconductor substrates are being loaded and unloaded. A substrate that is at room temperature will remove heat from a processing chamber if it is loaded into the chamber while that chamber is at or near the processing temperature. However, it may be desirable to maintain the temperature of the chamber as constant as possible for certain applications.

On the one hand, it may be possible to design a processing chamber to maintain a constant temperature such that the chamber does not experience large thermal fluctuations as substrates are cycled into and out of the chamber. The heater with a low thermal mass may be advantageous in this respect because it heats quickly and can be cooled quickly as well.

On the other hand, there are applications that require rapid temperature changes. For example, it may be advantageous to bake a substrate at a temperature that is 50° C. higher than a deposition to be carried out subsequently. In this example, the temperature may be lowered by 50° C. to perform the deposition after the bake, the bake and deposition process steps being performed within the same chamber. Additionally, the ability to cool rapidly is desirable when access to the chamber is required for maintenance.

A processing chamber that has a slow response may reduce throughput for some applications from, for example, about 40 to about 15 substrates per hour. Such throughput numbers depend, of course, on the nature of the process, the size of the substrate, the technology of the integrated circuits being fabricated, and many other factors as well. A processing chamber having a monolithic heater plate according to embodiments of the present invention may be configured to be responsive to the requirements of such a temperature change (both heating and cooling), due in part to the reduced thermal mass of a monolithic plate heater relative to a conventional heater.

Another advantage of the monolithic plate heater is concerned with the ability to route individual heating elements, which may comprise separate heating zones, such that the ends of the traces may be positioned to minimize the number of electrical feedthroughs in the chamber. Again, this is possible because of the compact nature of the monolithic heating plate, and the ability to design an efficient pathway of a heating trace within the heater.

Figure 9:
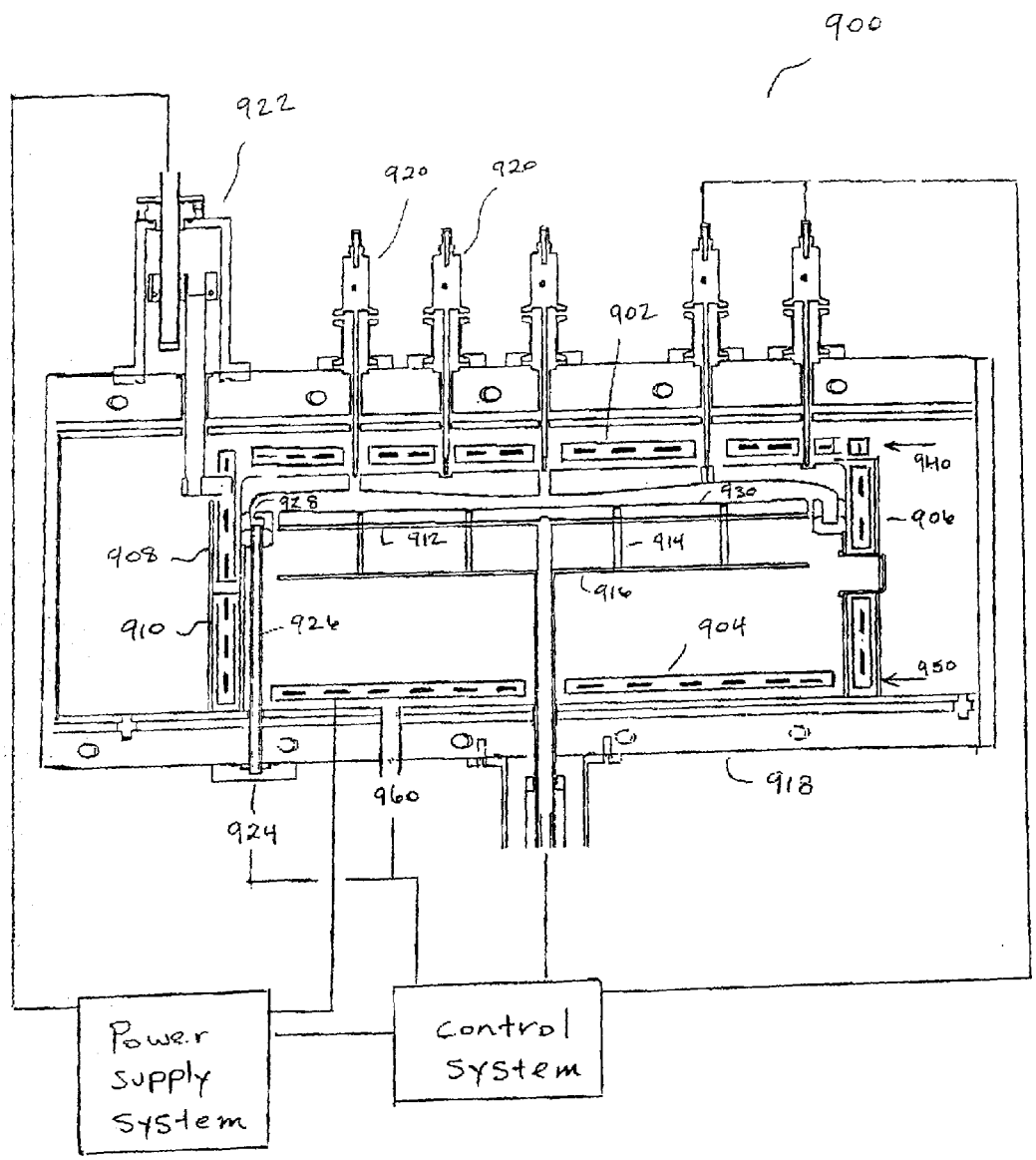
FIG. 9 is a side cross-sectional view of an exemplary processing chamber having monolithic plate heaters according to an embodiment of the present invention.

FIG. 9 illustrates an exemplary semiconductor processing chamber containing monolithic plate heaters according to an exemplary embodiment of the present invention. The chamber is generally indicated at 900. The chamber includes a top heater 902, a bottom heater 904, and side (peripheral) heater 906. These heaters may have multiple zones, such as an upper side heater 908 and a lower side heater 910. The compact nature of a chamber having monolithic heaters according to embodiments of the present invention will be appreciated by comparing FIG. 9 to FIG. 2.

Chamber 900 further includes a susceptor 912, substrate supports 914, substrate support plate 916, and chamber walls 918. The chamber may include a system for measuring substrate temperature 920, such as optical pyrometers. An electrical feedthrough is shown at 922, in this case connected to upper side heater 908. Reactive gases may be injected at gas supply port 924 to flow through conduit 926 and over the substrate starting from position 928. The substrate (not shown) would be placed on top of the susceptor on surface 930. Gases may be exhausted through port 960. A power supply system is connected to electrical feedthroughs (one of which is shown at 922) to drive the various zones of the top, bottom, and side heaters. A control system may be connected to the power supply system, gas supply port 924, gas exhaust 960, temperature measuring system 920, and substrate raising and lowering plate 916.

Figure 10:
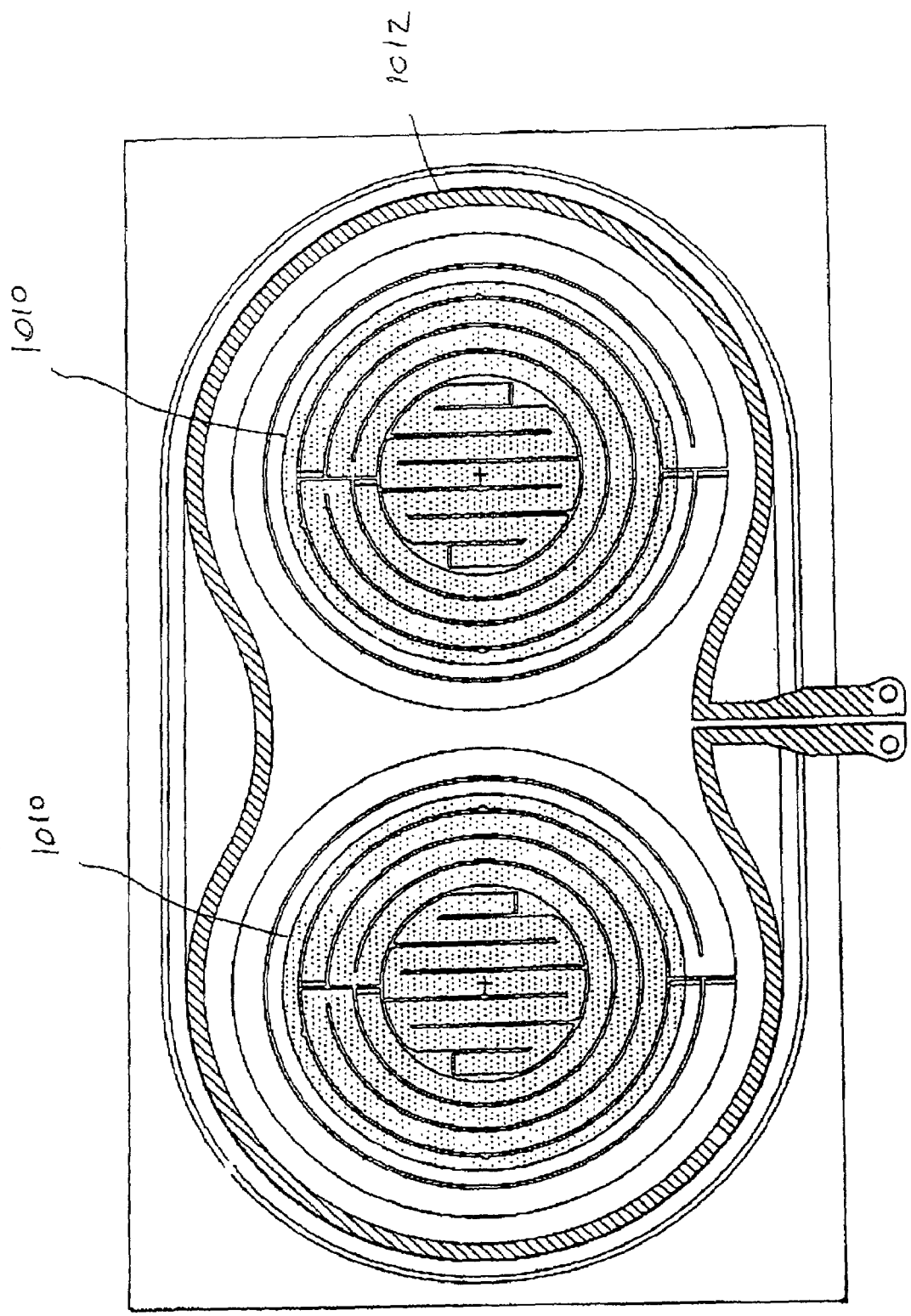
FIG. 10 is a plan view of a dual substrate processing chamber through a horizontal plane containing two top plate heaters.
Figure 11:
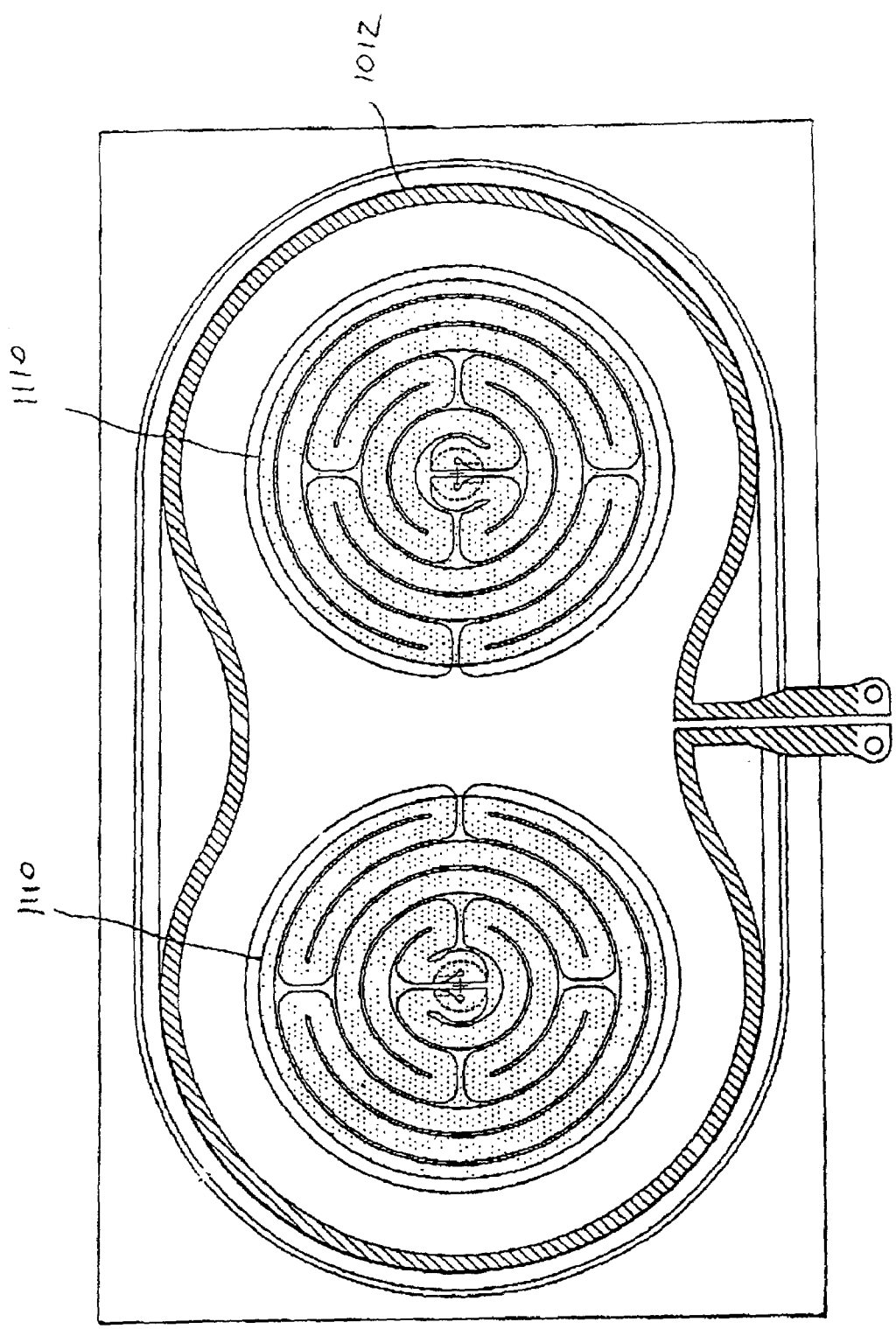
FIG. 11 is a plan view of a dual substrate processing chamber through a horizontal plane containing two bottom plate heaters.

A plan view of an exemplary chamber capable of processing two substrates is shown in FIGS. 10 and 11. FIG. 10 illustrates a horizontal section through the chamber roughly position 940 in FIG. 9, although it will be appreciated that FIG. 9 depicts a single substrate chamber. The heaters in FIG. 11 represent a horizontal section taken at a vertical position roughly illustrated by 950 in FIG. 9. FIGS. 10 and 11 are illustrative of the many different possible configurations and patterns the heating trace may have in a monolithic plate heater. In an exemplary embodiment the pattern of heater 1010 in FIG. 10 may be used for a top heater, and the pattern of heater 1110 in FIG. 11 may be used for a bottom heater. Both figures show a side heater in cross-section, represented by 1012.

While the present invention has been described with reference to exemplary embodiments, it will be readily apparent to those skilled in the art that the invention is not limited to the disclosed embodiments but, on the contrary, is intended to cover numerous other modifications and broad equivalent arrangements that are included within the spirit and scope of the following claims.

What is claimed is:

1. A resistive heater for heating a semiconductor processing chamber, the resistive heater comprising:
    a doped ceramic heating element shaped to form at least one continuous electrical path;
    an undoped ceramic material encasing at least a portion of the doped ceramic heating element to form a monolithic plate; and
    wherein the coefficient of thermal expansion of the doped ceramic heating element is substantially the same as the coefficient of thermal expansion of the undoped ceramic material.

2. The resistive heater of claim 1, wherein the doped ceramic heating element and the undoped ceramic material comprise silicon carbide.

3. The resistive heater of claim 2, wherein the dopant of the doped ceramic heating element comprises nitrogen.

4. The resistive heater of claim 3, wherein the dopant level of nitrogen within the doped ceramic heating element is between about 150 and 2000 ppm.

5. The resistive heater of claim 1, wherein the plate comprises a susceptor configured to support a semiconductor substrate during processing.

6. The resistive heater of claim 1, wherein the plate includes at least one substantially oval shaped aperture formed therein for allowing passage of a substrate support pin, the substantially oval shaped aperture having a major axis substantially parallel to a radius of the plate and sized to allow thermal expansion of the plate.

7. The resistive heater of claim 1, wherein the continuous electrical path comprises a plurality of concentric loops that alternate direction.

8. The resistive heater of claim 1, wherein the doped ceramic heating element is completely encased within the undoped ceramic material.

9. The resistive heater of claim 1, wherein the doped ceramic heating element and the undoped ceramic material comprise at least one of aluminum oxide, boron nitride and silicon nitride.

10. The resistive heater of claim 1, wherein the dopant of the doped ceramic heating element comprises at least one of boron, arsenic, antimony and phosphor.

11. The resistive heater of claim 1, wherein the thickness of the resistive heater ranges from about 0.1 to about 0.3 inches.

12. The resistive heater of claim 1, wherein the doped ceramic heating element has an electrical resistivity ranging from about 2 to about 5 orders of magnitude less than the electrical resistivity of the undoped ceramic material.

13. The resistive heater of claim 1, wherein the doped ceramic heating element forms at least two separate electrical paths to provide at least two separate heating zones.

14. A resistive heater for heating at least one semiconductor wafer, the resistive heater comprising:
    a doped ceramic heating element forming at least one continuous electrical path shaped to provide heat across a surface of the at least one semiconductor wafer; and
    an undoped ceramic material covering at least a front surface of the doped ceramic heating element to form a heating surface shaped to receive the at least one semiconductor wafer;
    wherein the coefficient of thermal expansion of the doped ceramic heating element is substantially the same as the coefficient of thermal expansion of the undoped ceramic material.

15. The resistive heater of claim 14, wherein the doped ceramic heating element and the undoped ceramic material comprise silicon carbide.

16. The resistive heater of claim 15, wherein the dopant of the doped ceramic heating element comprises nitrogen.

17. The resistive heater of claim 14, wherein the doped ceramic heating element forms a non-linear trace defining a plane.

18. The resistive heater of claim 17, further comprising a second doped ceramic heating element forming a non-linear trace within the plane.

19. The resistive heater of claim 17, wherein the heating surface defines a plane that is parallel to the plane defined by the ceramic heating element.

20. The resistive heater of claim 15, wherein the doped ceramic heating element forms a non-linear trace defining a plane and the heating surface defines a plane that is parallel to the plane defined by the ceramic heating element.

21. The resistive heater of claim 15, wherein the doped ceramic heating element traces a circular region corresponding to the shape of the semiconductor wafer.

22. A resistive heater for heating a semiconductor wafer, the resistive heater comprising:
    a doped ceramic heating element forming a trace having a plurality of adjacent segments; and
    an undoped ceramic material between the adjacent segments and forming a continuous surface for heating the semiconductor wafer;
    wherein the coefficient of thermal expansion of the doped ceramic heating element is substantially the same as the coefficient of thermal expansion of the undoped ceramic material.

23. The resistive heater of claim 22, wherein the undoped ceramic material is configured to hold the adjacent segments in a position spaced apart from one another.

24. The resistive heater of claim 22, wherein the continuous surface for heating the semiconductor substrate is planar and the trace of the doped ceramic heating element defines a plane parallel to the continuous surface for heating the semiconductor substrate.

25. A resistive heater for heating a semiconductor wafer, the resistive heater comprising:
    a susceptor comprising an undoped ceramic material shaped to receive the semiconductor substrate; and a doped ceramic heating element at least partially embedded within the susceptor;

wherein the coefficient of thermal expansion of the doped ceramic heating element is substantially the same as the coefficient of thermal expansion of the undoped ceramic material.

26. A resistive heater for heating a semiconductor wafer, the resistive heater comprising:

a first doped ceramic heating element;

a second doped ceramic heating element spaced apart from the first ceramic heating element; and an undoped ceramic material between the first doped ceramic heating element and the second doped ceramic heating element and forming a continuous surface between the first heating element and the second heating element for heating the semiconductor wafer;

wherein the coefficient of thermal expansion of the first doped ceramic heating element and the second doped heating element is substantially the same as the coefficient of thermal expansion of the undoped ceramic material.

27. The resistive heater of claim 26, wherein the first heating element and the second heating element each form a non-linear trace.

28. The resistive heater of claim 27, wherein the trace of the first heating element defines a plane and the trace of the second heating element is in the same plane.

29. The resistive heater of claim 28, wherein the continuous surface is planar and is parallel to the plane defined by the first heating element.

30. The resistive heater of claim 29, wherein the continuous surface comprises undoped silicon carbide and the first heating element comprises doped silicon carbide.

* * * * *